United States Patent
Lawlyes et al.

(10) Patent No.: US 7,563,992 B2
(45) Date of Patent: Jul. 21, 2009

(54) ELECTRONIC ENCLOSURE WITH CONTINUOUS GROUND CONTACT SURFACE

(75) Inventors: Daniel A. Lawlyes, Kokomo, IN (US); Joseph M. Ratell, Indianapolis, IN (US)

(73) Assignee: Delphi Technologies, Inc., Troy, MI (US)

( * ) Notice: Subject to any disclaimer, the term of this patent is extended or adjusted under 35 U.S.C. 154(b) by 124 days.

(21) Appl. No.: 11/523,985

(22) Filed: Sep. 20, 2006

(65) Prior Publication Data
US 2008/0066956 A1    Mar. 20, 2008

(51) Int. Cl.
*H01R 13/502* (2006.01)
(52) U.S. Cl. ............. 174/561; 174/564; 174/563; 361/747
(58) Field of Classification Search .......... 174/350.377, 174/535, 560, 561, 562, 563, 564; 361/816, 361/818, 728, 747; 439/76.2
See application file for complete search history.

(56) References Cited

U.S. PATENT DOCUMENTS

| | | | |
|---|---|---|---|
| 4,567,318 A | 1/1986 | Shu | |
| 5,001,298 A | 3/1991 | Jong | |
| 5,414,597 A | 5/1995 | Lindland et al. | |
| 5,475,566 A | 12/1995 | Rada et al. | |
| 5,682,299 A | 10/1997 | Kunert | |
| 5,994,643 A | 11/1999 | Saito | |
| 6,313,400 B1 * | 11/2001 | Mosquera et al. | 174/363 |
| 6,407,925 B1 * | 6/2002 | Kobayashi et al. | 361/752 |
| 6,549,426 B1 | 4/2003 | Lawlyes et al. | |
| 6,927,337 B2 * | 8/2005 | Kobayashi et al. | 174/535 |
| 6,977,337 B1 * | 12/2005 | Satullo et al. | 174/559 |
| 7,208,192 B2 * | 4/2007 | Bunyan et al. | 427/58 |
| 7,443,693 B2 * | 10/2008 | Arnold et al. | 361/800 |
| 2004/0012936 A1 | 1/2004 | Gravelin | |

OTHER PUBLICATIONS

European Search Report dated Nov. 28, 2008.

* cited by examiner

*Primary Examiner*—Hung V Ngo
(74) *Attorney, Agent, or Firm*—Jimmy L. Funke

(57) ABSTRACT

An enclosure for electronic circuitry is provided which has a first housing member having at least one protrusion formed in a wall and a second housing member having at least one slot for receiving the at least one protrusion and securing the second housing member to the first housing member. The second housing member and the first housing member have one or more continuous electrical ground contact surfaces. The second housing member is secured to the first housing member so that there is an interference fit between the at least one protrusion and at least one slot and so that there are one or more continuous electrical ground contact surfaces between the first housing member and the second housing member. A method of assembling an enclosure for electronic circuitry is provided.

17 Claims, 5 Drawing Sheets

ELECTRONIC ENCLOSURE WITH CONTINUOUS GROUND CONTACT SURFACE

TECHNICAL FIELD

The present invention generally relates to enclosures for electronic circuitry, and more particularly relates to electrical interconnection of the components of enclosures for electronic circuitry.

BACKGROUND OF THE INVENTION

Enclosures for electronic circuitry typically include a case or housing, a cover, a seal between the housing and the cover, and fasteners for attaching the cover to the housing. Usually, the housing and cover are made of an electrically conductive material (e.g., metal) and have matching shapes, e.g., a square shape. To assemble a conventional electronics enclosure, adhesive is applied near the perimeter of the housing. The cover is placed on top the adhesive surface. Fasteners are threaded through the cover, adhesive and housing to affix the cover to the housing and to establish electrical interconnection between the cover and the housing. The electrical interconnection at the fasteners provides direct current (DC) and radio frequency (RF) grounds in the fastener locations around the perimeter of the housing. The adhesive creates an environmental seal between the cover and housing. Enclosures for electronic circuitry without a seal are also well-known in the art.

Currently available electronic enclosures typically use four fasteners to secure a cover to a housing and to thus complete electrical continuity between the cover and the housing. One example of a conventional prior art electronic enclosure is shown in a cross-sectional view in FIG. 5. The generally square electronic enclosure 50 in FIG. 5 does not have an optimal continuous electronic ground contact surface between housing 51 and cover 52. Threaded fastener 53 passes between cover 52, adhesive 54, and housing 51. The exemplary conventional enclosure 50 has four fasteners (fastener 53 and three fasteners that are not shown) that are generally located at each of the four corners of enclosure 50. Fastener 53 and the three fasteners that are not shown provide electrical continuity between cover 52 and housing 51. Adhesive 56 is located between the product circuit board 55 and the product circuit board support 61 to adhere the assembly together. A ground pin 57 is attached to product circuit board 55 at interconnect 58. Ground pin 57 provides electrical conductivity between circuit board 55 and housing 51 so that circuit board 55 and housing 51 are at the same voltage potential. The adhesive 54 of enclosure 50 acts as a seal to keep contaminants out of the electronic enclosure.

The method of assembly of the conventional electronic enclosure 50 typically includes assembling electronics in the housing 51, dispensing adhesive 54 continuously along the perimeter of the housing 51, laying the cover 52 on the adhesive 54 surface 59, and passing fastener 53 and the three fasteners that are not shown through the cover 52 and into the housing 51 through adhesive 54. Typically, a machine tool will compress the cover 52 onto the seal surface 59 of adhesive 54. Thereafter, the cover 52 is fastened down with fasteners 53 and the three fasteners that are not shown.

Known electronic enclosures often are generally not efficient. The use of separate fasteners to affix the cover to the housing complicates the assembly process of the cover to the housing. Further, separate fasteners limit the amount of electrical continuity between the cover and the housing. The arrangement of the fasteners, the cover, and the housing results in difficult dispersion of adhesive between the cover and the housing and does not provide optimal seal integrity. Repair of an enclosure with four separate fasteners, a housing, a cover, and a seal is difficult.

Accordingly, it is therefore desirable to provide for an electronic enclosure with continuous electrical ground contact surface that may solve the aforementioned problems and provide conductive efficiency, grounding, sealing, assembly and repairability advantages over a conventional electronic enclosure.

SUMMARY OF THE INVENTION

In accordance with the teachings of the present invention, an electronic enclosure with continuous electrical ground contact surface is provided. The electronic enclosure with continuous ground contact surface can be used in a variety of applications including, but not limited to, automotive applications.

According to one aspect of the present invention, the enclosure for electronic circuitry includes a first housing member comprising at least one protrusion formed in a wall, a second housing member comprising at least one slot for receiving said at least one protrusion such that there is an interference fit between the at least one slot and the at least one protrusion. The interference fit secures the second housing member to the first housing member, and the interference fit provides one or more continuous electrical ground contact surfaces between the at least one slot and the at least one protrusion.

According to another aspect of the present invention, the enclosure for electronic circuitry includes a housing having a continuous trough near its outer perimeter. The trough has a bottom wall and one or more posts extending from the bottom wall of the trough. The enclosure also has a cover having an interface surface. The interface surface is near the outer perimeter of the cover. The interface surface has one or more slots for receiving the one or more posts of the housing such that there is an interference fit between the one or more slots and the one or more posts that secures the cover to the housing. The interference fit provides one or more continuous electrical ground contact surfaces between the one or more slots and the one or more posts. An adhesive sealant is disposed within the trough and between the housing and the cover.

According to yet another aspect of the present invention, a method of assembling an enclosure for electronic circuitry involves providing a first housing member comprising at least one protrusion formed in a wall and providing a second housing member comprising at least one slot. The second housing member is secured to the first housing member so that there is an interference fit between the at least one protrusion and the at least one slot and so that there are one or more continuous electrical ground contact surfaces between the first housing member and the second housing member.

Accordingly, the enclosure for electronic circuitry provides one or more of the following advantages: it eliminates the cover to housing fasteners; it provides one or more continuous ground contact surfaces; it achieves easy sealant dispersion; it improves seal integrity; it improves the repairability of the enclosure; it provides a unique attachment of a cover to a housing to achieve electrical continuity; it provides a complete perimeter adhesive between the housing and the cover; and it is efficient and inexpensive to manufacture.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
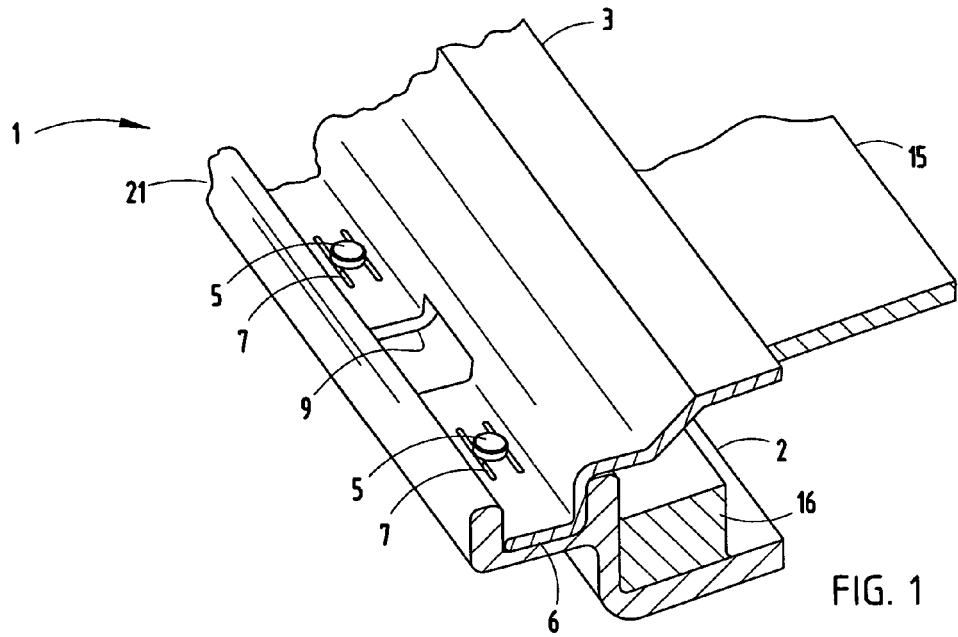
FIG. 1 is a perspective view of a section of an electronic enclosure with continuous electrical ground surface according to a first embodiment of the present invention.
Figure 2:
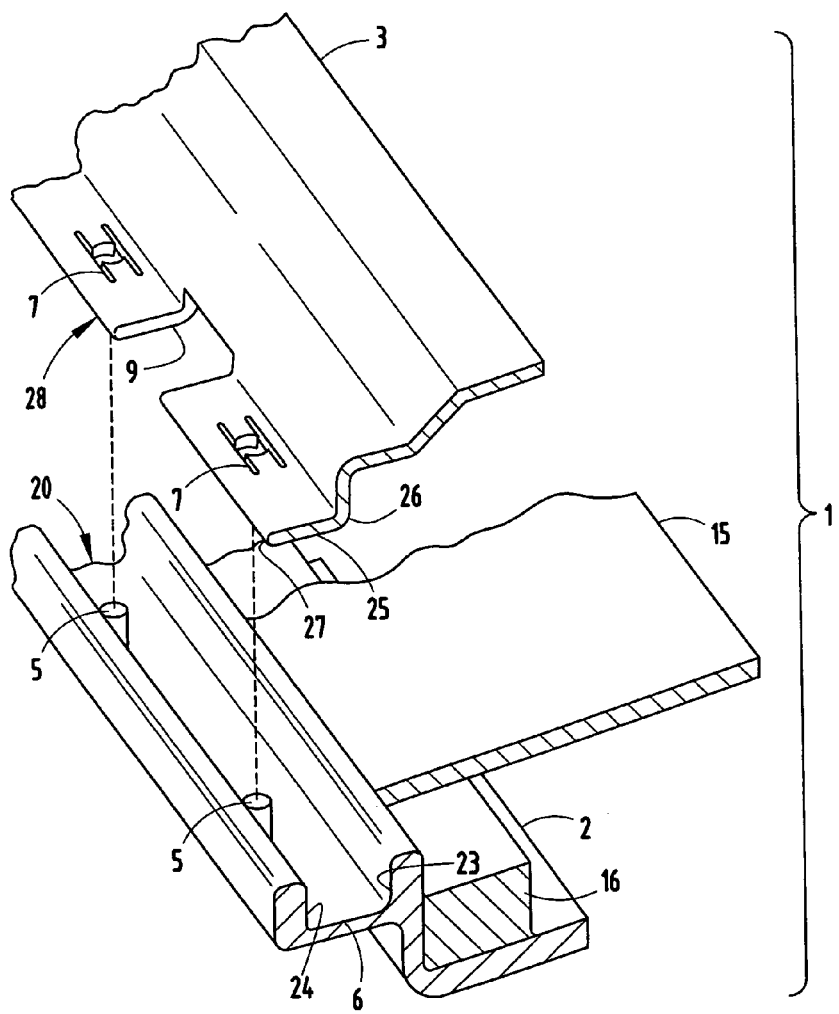
FIG. 2 is an exploded view of the electronic enclosure section shown in FIG. 1.
Figure 3:
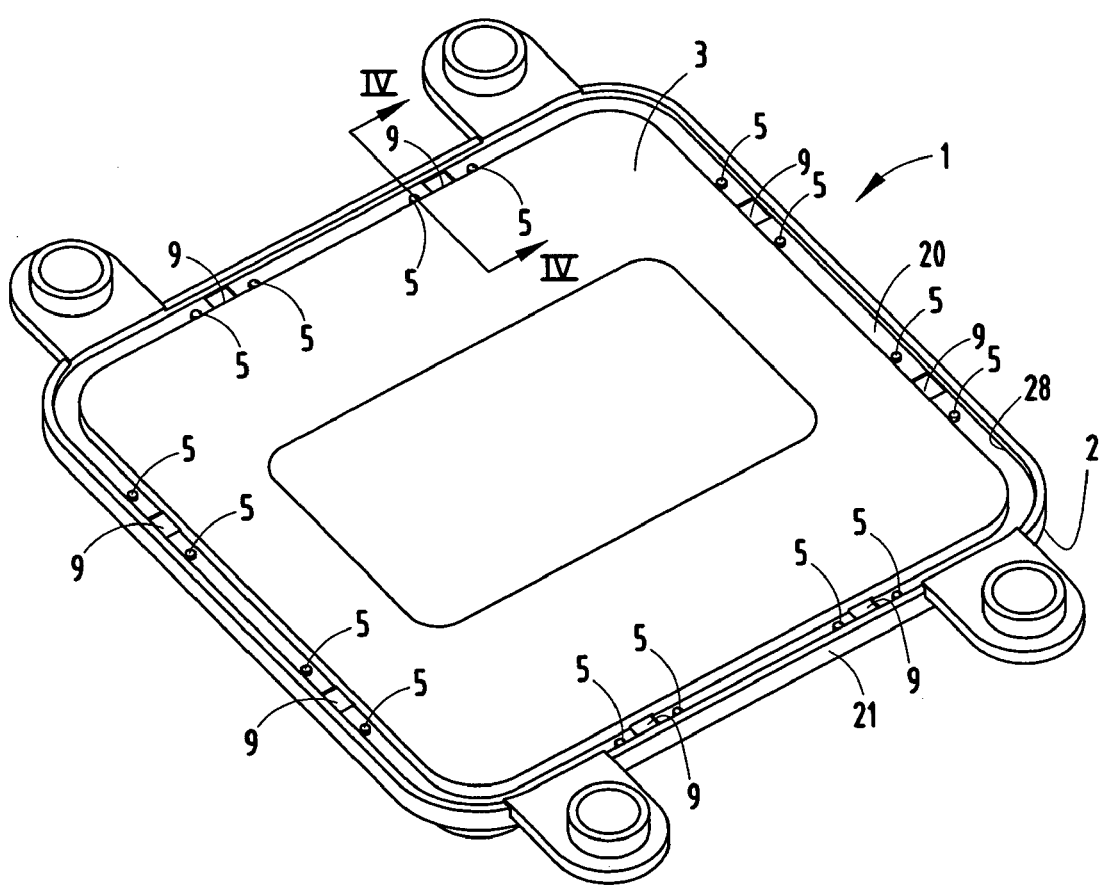
FIG. 3 is a perspective view of the entire electronic enclosure that is shown partially in FIG. 1.

Referring now to FIGS. 1-3, an electronic enclosure 1 is illustrated that embodies one embodiment with a continuous electrical ground surface. The electronic enclosure 1 may be configured to enclose any variety of electronic circuitry located within the enclosure 1. For example, the electronic enclosure 1 may enclose a circuit board containing electrical circuitry and any of a number of electronic components. The electronic enclosure 1 with continuous ground contact surface may be of a rectangular (e.g., square) or other shape. Also, the electronic enclosure 1 may be used in a variety of applications, including automotive applications.

As seen in FIG. 1, first and a second housing members, referred to as housing 2 and cover 3, respectively, of the electronic enclosure 1 are secured to one another by posts 5 formed in bottom wall 6 of trough 20 of housing 2 and received by slots 7 of cover 3. The housing members 2 and 3 are formed of electrically conductive materials, such as steel or aluminium. A circuit board 15 is located in the enclosure 1 shown mounted on top of circuit board support 16. An interference fit between each post 5 and slot 7 secures cover 3 to housing 2. Prior to assembly, the diameter of each post 5 is larger than the diameter or width of the opening of corresponding slot 7 so as to form an interference fit. The cover 3 is stamped onto or otherwise attached to the housing 2 to achieve the interference fit between each post 5 and corresponding slot 7.

Figure 4:
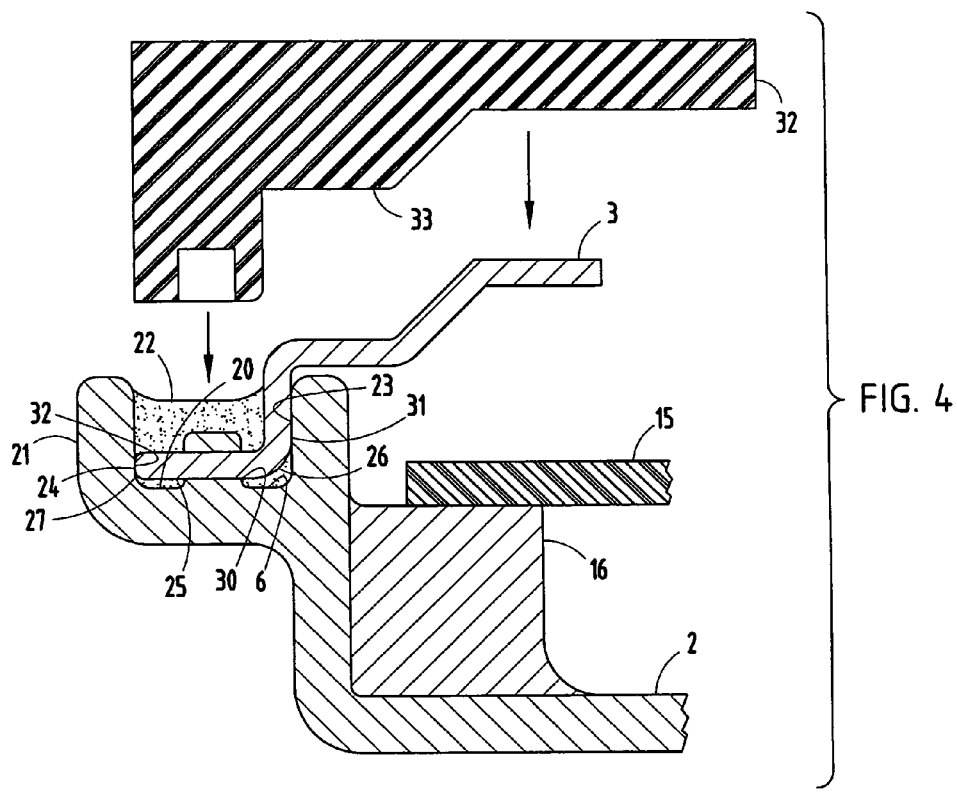
FIG. 4 is a cross-sectional view of a portion of the electronic enclosure shown in FIG. 3 taken through line IV-IV in FIG. 3.
Figure 5:
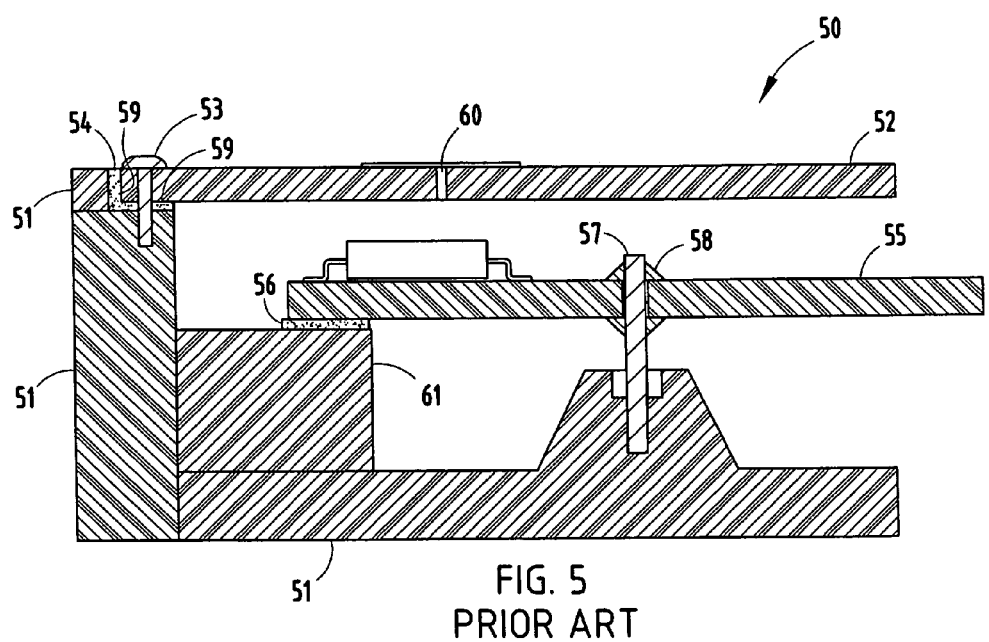
FIG. 5 is a cross-sectional view of a portion of a prior art electronic enclosure.

Referring now to FIGS. 2-4, trough 20 of housing 2 is located near the perimeter 21 of housing 2. Adhesive 22 is located within trough 20. Trough 20 is continuous along the perimeter 21 of housing 2. The trough 20 includes inner wall 23, outer wall 24 and bottom wall 6. Cover 3 includes an interface surface 25, a heel 26 and a toe 27. The interface surface 25, heel 26 and toe 27 of cover 3 extend around the perimeter 28 of cover 3. Gaps in the interface surface 25, heel 26 and toe 27 of cover 3 occur at cover 3 openings 9.

The electronic enclosure 1 with continuous ground contact surface depicted in FIGS. 1-4 has one or more continuous electrical ground contact surfaces 30. One continuous electrical ground contact surface 30 is provided by the contact between one or more posts 5 and one or more slots 7. A second continuous electrical ground contact surface 31 is provided by the surface contact between the heel 26 of the cover 3 and inner wall 23 of trough 20 of housing 2. A third continuous electrical ground contact surface 32 is provided by surface contact between toe 27 of cover 3 and outer wall 24 of trough 20. A possible fourth continuous electrical ground contact surface is provided by surface contact between exterior bottom surface 25 of cover 3 and bottom wall 6 of housing 2. At each continuous electrical ground contact surface 30, 31, 32 the voltage potential of the housing members, i.e., housing 3 and cover 2, is the same.

The interference fit between one or more posts 5 of housing 2 and the inner walls of one or more slots 7 of cover 3 secures the cover 3 to the housing 2 and creates one or more continuous electrical ground contact surfaces. Generally, the greater the continuous electrical ground contact surface between the housing 2 and cover 3, the better the electrical continuity between housing 2 and cover 3, and the better the electrical ground for the electronic enclosure 1. In the ideal case, continuous ground contact surfaces occur between posts 5 and walls of slots 7, heel 26 and inner wall 23, toe 27 and outer wall 24, and interface surface 25 and bottom wall 6.

Referring now to FIG. 4, the adhesive 22 within trough 20 provides a seal and prevents damaging elements, such as corrosive materials, from entering into the electronic enclosure 1. FIGS. 1-3 and FIGS. 6-9 do not show the adhesive because inclusion of adhesive would complicate drawing views of FIGS. 1-3 and FIGS. 6-9. The embodiments of FIGS. 1-3 and FIGS. 6-9 may include adhesive even though it is not shown in the drawings. The present invention includes embodiments with and without a sealant (e.g., adhesive).

The method of assembling the electrical enclosure with continuous electrical ground contact surface involves staking the cover 3 into the trough 20 of housing 2 so that the slots 7 are staked onto the corresponding posts 5 of the housing 2. One embodiment of a cover seating tool 40 for stamping cover 3 onto housing 2 is shown in FIG. 4. Stamping surface 41 of cover seating tool 40 may be made of rubber, neoprene or a material with similar elastomeric characteristics. After cover 3 is stamped onto housing 2, adhesive 22 is dispensed in the cover 3 to housing 2 engagement area where the cover 3 and housing 2 form trough 20 to hold the adhesive 22. Adhesive 22 flows between the cover 3 and housing 2 within the trough 20. The openings 9 of cover 3 provide a space for adhesive 22 to be pumped and injected, or to flow on its own accord due to gravity and surface tension effects, between the cover 3 and the trough 20. Adhesive 22 is also located above cover 3. Silicone adhesive or other known adhesives may be employed.

Cover 3 and housing 2 are electrically conductive and thus form one or more continuous ground contact surfaces. Typically, both the cover 3 and housing 2 are a metal, such as aluminum. Housing 2 may be made of a non-conductive material such as plastic so long as a metal lead frame is present within the plastic to provide electrical conductors. The cover 3 and housing 2 made of non-conductive and conductive materials will have features designed to ensure the contact of electrically conductive elements, thereby providing electrical continuity. The electrical continuity between housing 2 and cover 3 creates a Faraday shield that insulates box noise traveling from the outside to the inside of the enclosure and from the inside to the outside of the enclosure. Thus, the enclosure both physically encloses the electronics and provides an electrical ground shield.

Figure 6:
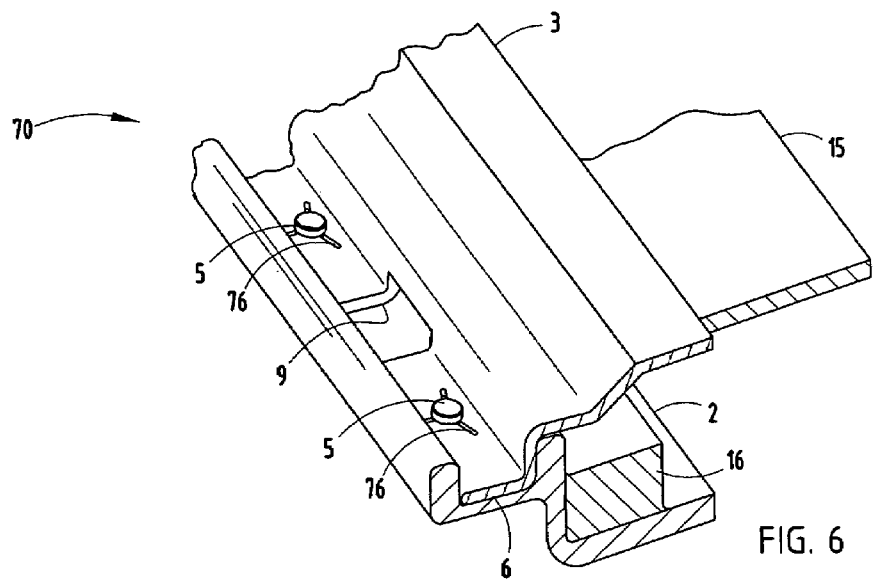
FIG. 6 is a perspective view of a section of an electronic enclosure having a continuous electrical ground contact surface according to a second embodiment of the present invention.
Figure 7:
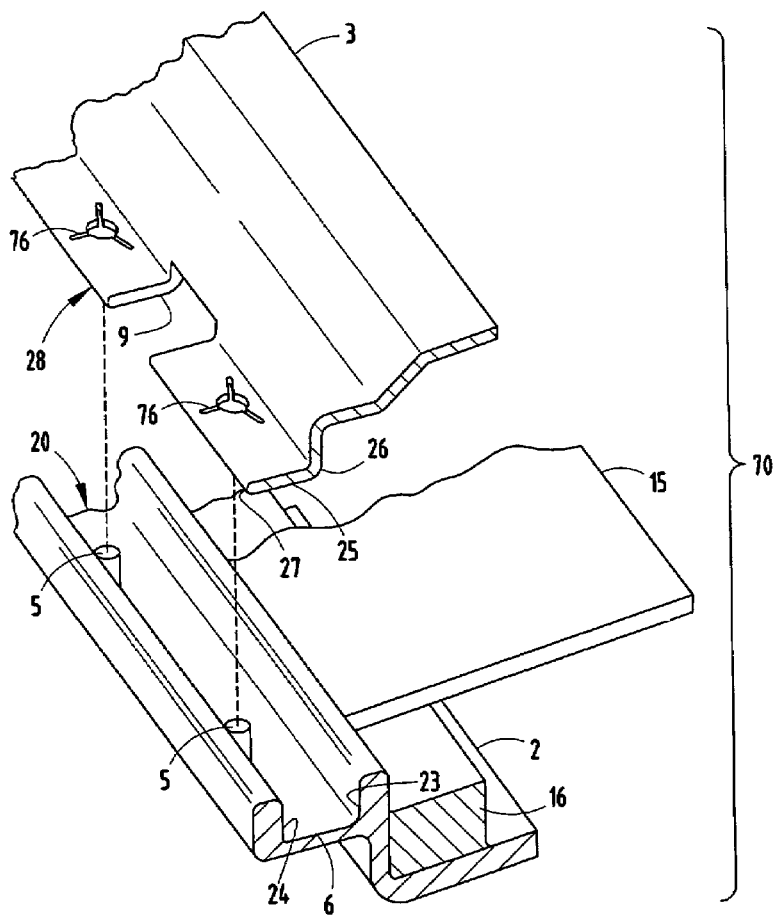
FIG. 7 is an exploded view of the electronic enclosure shown in FIG. 7.

Referring now to FIGS. 6 and 7, an electronic enclosure 70 is shown according to a the second embodiment of the present invention. The electronic enclosure 70 of the second embodiment is substantially identical to the electronic enclosure 1 of the first embodiment in all aspects other than the shape of slots 76. Each slot 76 is made up of a hole with three equidistantly spaced recesses extending radially from the hole.

Figure 8:
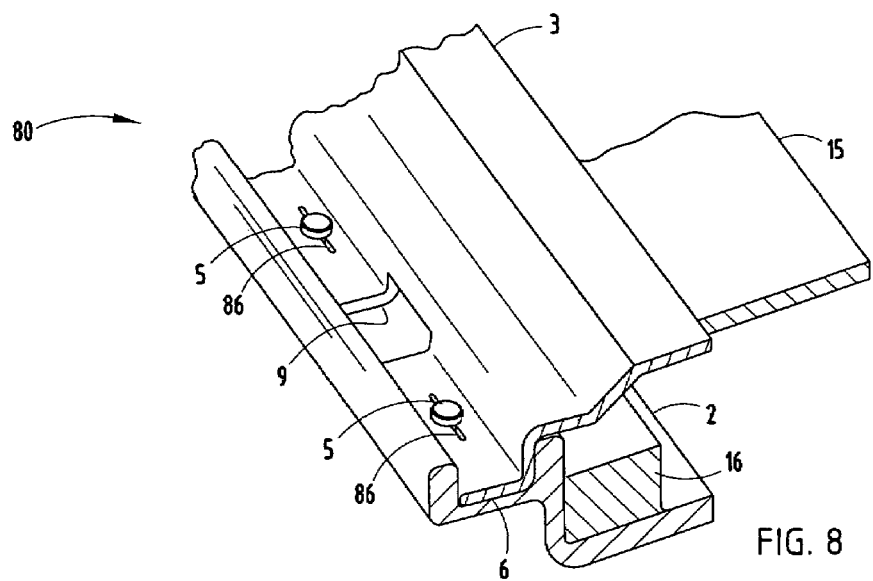
FIG. 8 is a perspective view of a section of a portion of an electronic enclosure with continuous electrical ground contact surface according to a third embodiment of the present invention.
Figure 9:
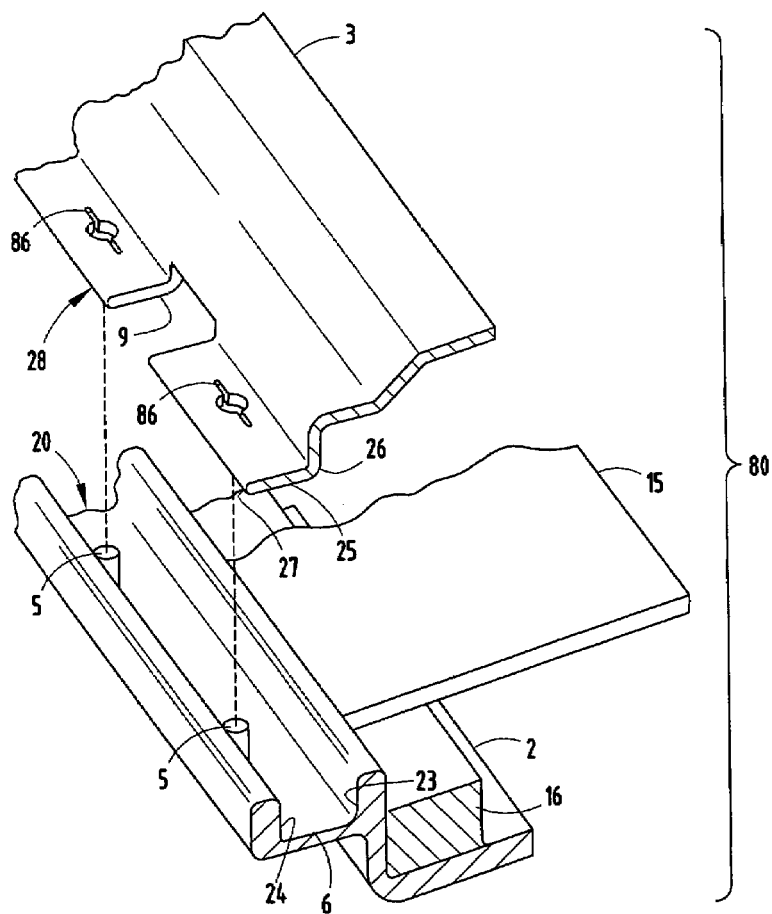
FIG. 9 is an exploded view of the electronic enclosure shown in FIG. 8.

Referring to FIGS. 8 and 9, an electronic enclosure 80 is shown according to the third embodiment of the present invention. The electronic enclosure 80 of the third embodiment is substantially identical to the electronic enclosure 1 of the first embodiment in all aspects except the shape of the slots 86. Each slot 86 is made up of a hole with two recesses extending radially from opposite sides of the hole.

Accordingly, the electronic enclosure 1, 70, 80 provides one or more continuous electronic ground contact surfaces 30, 31, 32 and eliminates separate cover to housing fasteners. The electronic enclosure: provides a unique attachment of a cover to a housing to achieve electrical continuity; achieves easy sealant dispersion, improved seal integrity, and improved repairability; provides a complete perimeter of adhesive between the housing and the cover; and is efficient and inexpensive to manufacture.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An enclosure for electronic circuitry comprising:
a first housing member comprising at least one protrusion formed in a wall, wherein said at least one protrusion is located at or near a perimeter of said first housing member;
a second housing member comprising at least one slot for receiving said at least one protrusion such that there is an interference fit between said at least one slot and said at least one protrusion that secures said second housing member to said first housing member, wherein said at least one slot for receiving said at least one protrusion is located at or near a perimeter of said second housing member;
a trough near the perimeter of said first housing member, said trough being continuous, with said at least one protrusion located within said trough, and said interference fit providing one or more continuous electrical ground contact surfaces between said at least one slot and said at least one protrusion.

2. The enclosure for electrical circuitry of claim 1 further comprising:
a seal between said first housing member and said second housing member.

3. The enclosure for electrical circuitry of claim 1 further comprising:
a seal between said first housing member and said second housing member within said trough.

4. The enclosure for electrical circuitry of claim 3 wherein:
said trough comprises a bottom wall in which said at least one protrusion is formed, an inner wall and an outer wall;
said second housing member has a toe, a heel, and an interface surface;
said toe of said second housing member is adjacent to said outer wall of said trough;
said heel of said second housing member is adjacent to said inner wall of said trough; and
said interface surface of said second housing member is adjacent to said bottom wall of said trough.

5. The enclosure for electrical circuitry of claim 4 further comprising:
an interference fit between said heel of said second housing member and said inner wall of said trough, said interference fit providing one or more continuous electrical ground contact surfaces between said heel of said second housing member and said inner wall of said trough.

6. The enclosure for electrical circuitry of claim 5 further comprising:
an interference fit between said toe of said second housing member and said outer wall of said tough, said interference fit providing one or more continuous electrical ground contact surfaces between said toe of said second housing member and said outer wall of said trough.

7. The enclosure for electrical circuitry of claim 6 further comprising:
a fit between said interface surface of said second housing member and said bottom wall of said trough, said fit providing one or more continuous electrical ground contact surfaces between said interface surface of said second housing member and said bottom wall of said trough.

8. The enclosure for electrical circuitry of claim 7 wherein:
said first housing member has a generally rectangular shape and said second housing member has a generally rectangular shape;
said at least one protrusion of said first housing member consists of sixteen protrusions wherein four protrusions are located along each side of said generally rectangular first housing member; and
said at least one slot of said second housing member consists of sixteen slots wherein four slots are located along each side of said generally rectangular second housing member.

9. An enclosure for electrical circuitry comprising:
a housing having a continuous trough near an outer perimeter, said trough having a bottom wall and one or more posts extending from said bottom wall of said trough;
a cover having an interface surface, said interface surface being near said outer perimeter of said cover, said interface surface having one or more slots for receiving said one or more posts such that there is an interference fit between said one or more slots and said one or more posts that secures said cover to said housing, said interference fit providing one or more continuous electrical ground contact surfaces between said one or more slots and said one or more posts; and
an adhesive sealant dispensed within said trough and between said housing and said cover.

10. The enclosure for electrical circuitry of claim 9 wherein:
said housing has four sides and said cover has four sides, and said one or more posts extend from said trough at each of said four sides of said housing, and wherein the one or more slots are at each of said four sides of said cover.

11. The enclosure for electrical circuitry of claim 10 wherein:
said trough has an outer wall and an inner wall;

said cover has a toe and a heel;

said toe of said cover is adjacent to said outer wall of said trough;

said heel of said cover is adjacent to said inside inner wall of said trough; and said interface surface of said cover is adjacent to said bottom wall of said trough.

12. The enclosure for electronic circuitry of claim 11 further comprising:

an interference fit between said heel of said cover and said inner wall of said trough, said interference fit providing one or more continuous electrical ground contact surfaces between said heel of said cover and said inner wall of said tough.

13. The enclosure for electronic circuitry of claim 12 further comprising:

an interference fit between said toe of said cover and said outer wall of said trough, said interference fit providing one or more continuous electrical ground contact surfaces between said toe of said cover and said outer wall of said trough.

14. The enclosure for electronic circuitry of claim 13 further comprising:

a fit between said interface surface of said cover and said bottom wall of said trough, said fit providing one or more continuous electrical ground contact surfaces between said interface surface of said cover and said bottom wall of said trough.

15. A method for assembling an enclosure for electronic circuitry comprising the steps of:

providing a first housing member comprising at least one protrusion formed in a wall located in a bottom of a trough and extending from the bottom of the trough, said trough being continuous and near a perimeter of said first housing member;

providing a second housing member comprising at least one slot wherein said at least one protrusion comprises a plurality of posts and said at least one slot comprises a plurality of slots;

securing the second housing member to the first housing member so that there is an interference fit between said at least one protrusion and said at least one slot and so that there are one or more continuous electrical ground contact surfaces between said first housing member and said second housing member.

16. The method for assembly of the enclosure for electronic circuitry of claim 15 further comprising:

dispensing a sealant between the first housing member and the second housing member.

17. The method for assembly of the enclosure for electronic circuitry of claim 16 further comprising:

mounting one or more electronic devices in one of the housing members.

* * * * *